United States Patent
Roux et al.

(10) Patent No.: US 6,984,474 B2
(45) Date of Patent: Jan. 10, 2006

(54) RETICLE BARRIER SYSTEM FOR EXTREME ULTRA-VIOLET LITHOGRAPHY

(75) Inventors: Stephen Roux, New Fairfield, CT (US); Richard Lenox, Trumbull, CT (US)

(73) Assignee: ASML Holding N.V., (NL)

( * ) Notice: Subject to any disclaimer, the term of this patent is extended or adjusted under 35 U.S.C. 154(b) by 151 days.

(21) Appl. No.: 10/628,326

(22) Filed: Jul. 29, 2003

(65) Prior Publication Data

US 2005/0026045 A1 Feb. 3, 2005

(51) Int. Cl.
*G03F 9/00* (2006.01)
*A47G 1/12* (2006.01)

(52) U.S. Cl. ............................................ 430/5; 428/14

(58) Field of Classification Search .................... 430/5; 428/14

See application file for complete search history.

(56) References Cited

U.S. PATENT DOCUMENTS 6,239,863 B1 * 5/2001 Catey et al. .................. 355/75

* cited by examiner

*Primary Examiner*—Saleha R. Mohamedulla
(74) *Attorney, Agent, or Firm*—Sterne, Kessler, Goldstein & Fox, P.L.L.C.

(57) ABSTRACT

The present invention is directed to a reticle barrier system that prevents contaminants from landing on a mask within lithographic systems using extreme ultra violet light. In particular, a reticle barrier system is provided that consists of a mask barrier and a set of contact barriers. The mask barrier surrounds a mask formed on a reticle, while the contact barriers are affixed between the mask and contact spots on a reticle. The barriers have a height relative to the mask, and different geometries are provided. Collectively, the mask and contact barriers reduce the number of contaminants landing on a mask surface without the use of a pellicle. In an alternate embodiment, the reticle barrier system includes only a mask barrier. Similarly, in another alternate embodiment, the reticle barrier system includes only contact barriers.

13 Claims, 11 Drawing Sheets cross section

RETICLE BARRIER SYSTEM FOR EXTREME ULTRA-VIOLET LITHOGRAPHY

BACKGROUND OF THE INVENTION

1. Field of the Invention

The present invention relates to lithography, and more particularly, to reticle barrier systems used in lithography.

2. Background of Invention

Lithography is a process used to create features on the surface of substrates. Such substrates can include those used in the manufacture of flat panel displays, circuit boards, various integrated circuits, and the like. A semiconductor wafer; for example, can be used as a substrate to fabricate an integrated circuit.

During lithography, a reticle is used to transfer a desired pattern onto a substrate. The reticle is formed of a material transparent to the lithographic wavelength being used, for example glass in the case of visible light. The reticle has an image printed on it. The size of the reticle is chosen for the specific system in which it is used. A reticle six inches by six inches and one-quarter inch thick may be used, for example. During lithography, a wafer, which is disposed on a wafer stage, is exposed to an image projected onto the surface of the wafer corresponding to the image printed on the reticle.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer.

As should be clear from the above discussion, the accurate location and size of features produced through lithography is directly related to the precision and accuracy of the image projected onto the wafer.

The rigors of sub-100 nm lithography place stringent demands not only on the lithography tool, but also on the reticle. Airborne particles and dust that settle on the reticle can cause defects on the wafer. Small image distortions or displacements in the reticle plane can swamp critical dimension and create overlay errors. The conventional solution is to use a thin piece of permanently fixed transparent material as a pellicle for the reticle to protect against particles.

This pellicle remains in place during all stages of the lithography process. A pellicle has a dual role in maintaining the accuracy of the image projected onto a wafer. First, a pellicle serves to protect the reticle from direct contact with particulate contamination. Particles that settle on the reticle can produce image distortion and/or defects. Therefore, allowing particles to settle on the reticle must be avoided. Removal of particles from the reticle can cause damage to the reticle because such removal may involve direct contact with the reticle. When a pellicle is used, particles will settle on the pellicle rather than the reticle. Thus, it is the pellicle that must be cleaned. Cleaning the pellicle rather than the reticle poses fewer dangers to the integrity of the reticle since the reticle is protected during this cleaning by the pellicle itself.

The second role played by a pellicle is related to the standoff of the pellicle. During exposure, the focal plane corresponds to the location of the image printed on the reticle. By including a pellicle, any particles in the system will settle on the pellicle rather than the reticle. By virtue of the height of the pellicle, and thus the distance between the surface of the pellicle and the patterned surface of the reticle, these particles will not be in the focal plane. Since the pellicle lifts the particles out of the focal plane, the probability that the image projected onto the substrate will include these particles is greatly reduced.

This solution discussed above works well in many conventional lithographic processing techniques. Since materials are available for producing transparent pellicles and reticles, the use of such a system is convenient in, for example, a system in which light must pass through both the reticle and the pellicle.

The pellicle approach, however, is not well suited for use in extreme-ultraviolet (EUV) applications. Currently, there are no materials sufficiently transparent to EUV that can be used to make a pellicle. In EUV lithography, the EUV does not pass through the reticle, but is reflected off the image side of the reticle. This technique is known as reflective lithography. If a pellicle were to be used in a reflective lithography process, the EUV would necessarily pass through the pellicle twice, once on the way to the reticle and again after reflecting off of the reticle. Thus, any amount of light loss associated with the pellicle is effectively doubled with EUV processing techniques.

In the absence of a pellicle, contaminants will land on the surface of the mask and degrade the quality of the wafers produced in EUV applications. Many techniques have been employed to reduce the number of contaminants that can land on a mask. In particular, extreme care is taken to ensure a clean environment around the mask. For example, in addition to clean room environments and operating within a vacuum, other steps are taken to minimize contaminants, such as reticles being typically transported mask side down to minimize the settling of debris on the mask.

Nonetheless, airborne and inside-vacuum contaminants exist that can adhere to a mask. In particular, contact spots on a reticle used to hold the reticle for transportation and placement within the lithographic device generate small contaminants or debris that can land on a mask. One type of contact spot is any region on a reticle that is physically touched by robotic arm end effectors, or the like, to move or position the reticle.

What is needed is a mask barrier system for use in extreme ultraviolet light that reduces the number of contaminants landing on a mask, without inducing adverse impacts such as absorption of EUV light.

SUMMARY OF THE INVENTION

The present invention is directed to a reticle barrier system that prevents contaminants from landing on a mask within lithographic systems using extreme ultra violet light. In particular, a reticle barrier system is provided that consists of a mask barrier and a set of contact barriers. The mask barrier surrounds a mask formed on a reticle, while the contact barriers are affixed between the mask and contact spots on a reticle. The barriers have a height relative to the mask, and different geometries are provided. Collectively, the mask and contact barriers reduce the number of contaminants landing on a mask surface without the use of a pellicle. In an alternate embodiment, the reticle barrier system includes only a mask barrier. Similarly, in another alternate embodiment, the reticle barrier system includes only barriers around contact spots.

There are numerous benefits associated with the use of a reticle barrier system. First, the reticle barrier system significantly reduces the number of contaminants landing on the surface of a mask, and therefore the quality of wafers produced in an EUV lithographic system can be greatly enhanced. Second, unlike pellicles a reticle barrier system can be used in EUV lithographic systems.

Further embodiments, features, and advantages of the invention, as well as the structure and operation of the various embodiments of the invetion are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 1A:
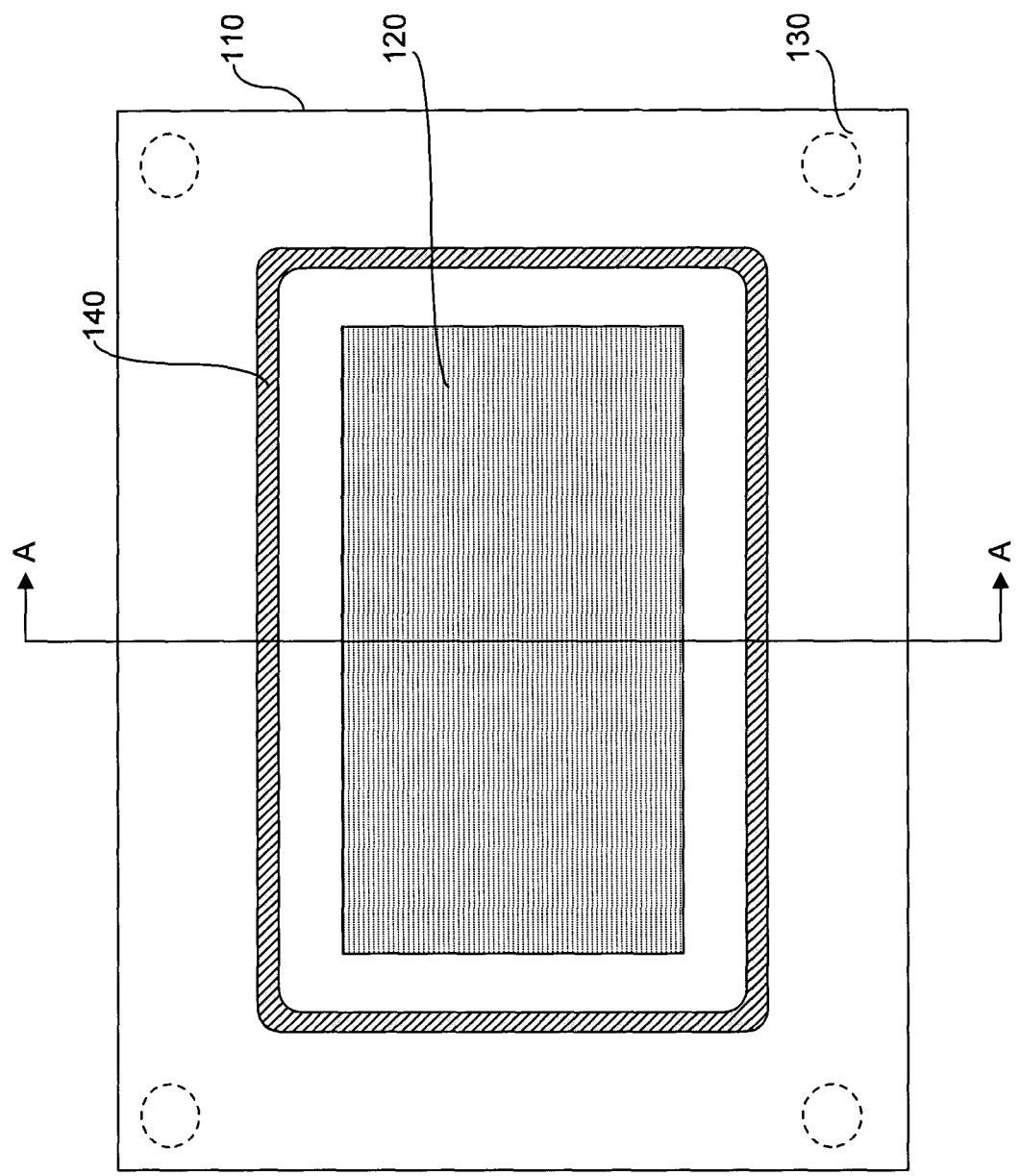
FIG. 1A is a diagram of a lithographic reticle having a mask with a pellicle.
Figure 1B:
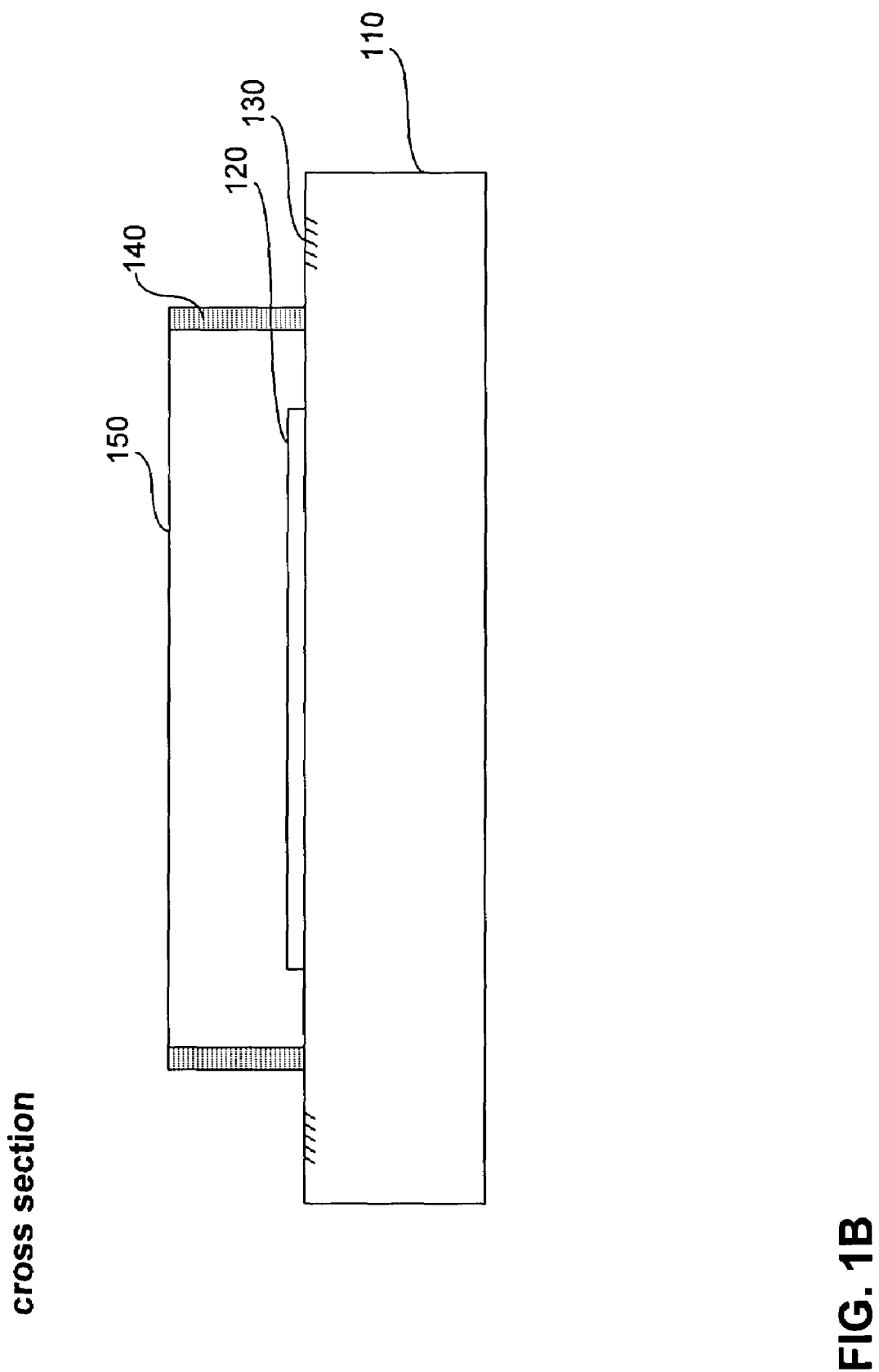
FIG. 1B is a diagram of a cross sectional view of the lithographic reticle having a mask with a pellicle.

FIG. 1A provides a diagram of a lithographic reticle having a mask with a pellicle. Such an arrangement is commonly used in lithogrpahic applications other than those involving extreme ultraviolet (EUV). The system includes reticle 110; mask 120; contact spots, such as contact spot 130; and pellicle frame 140. In addition, as illustrated in FIG. 1B, which is a cross sectional view of the system depicted in FIG. 1A, the system also includes pellicle 150. As discussed above, pellicle 150 prevents contaminants from landing on the surface of mask 120. Pellicle 150 is a transparent membrane that is stretched across pellicle frame 140. As discussed above, if used in EUV lithography pellicle 150 will lead to significant absorption of EUV light and degrade system performance.

Figure 2A:
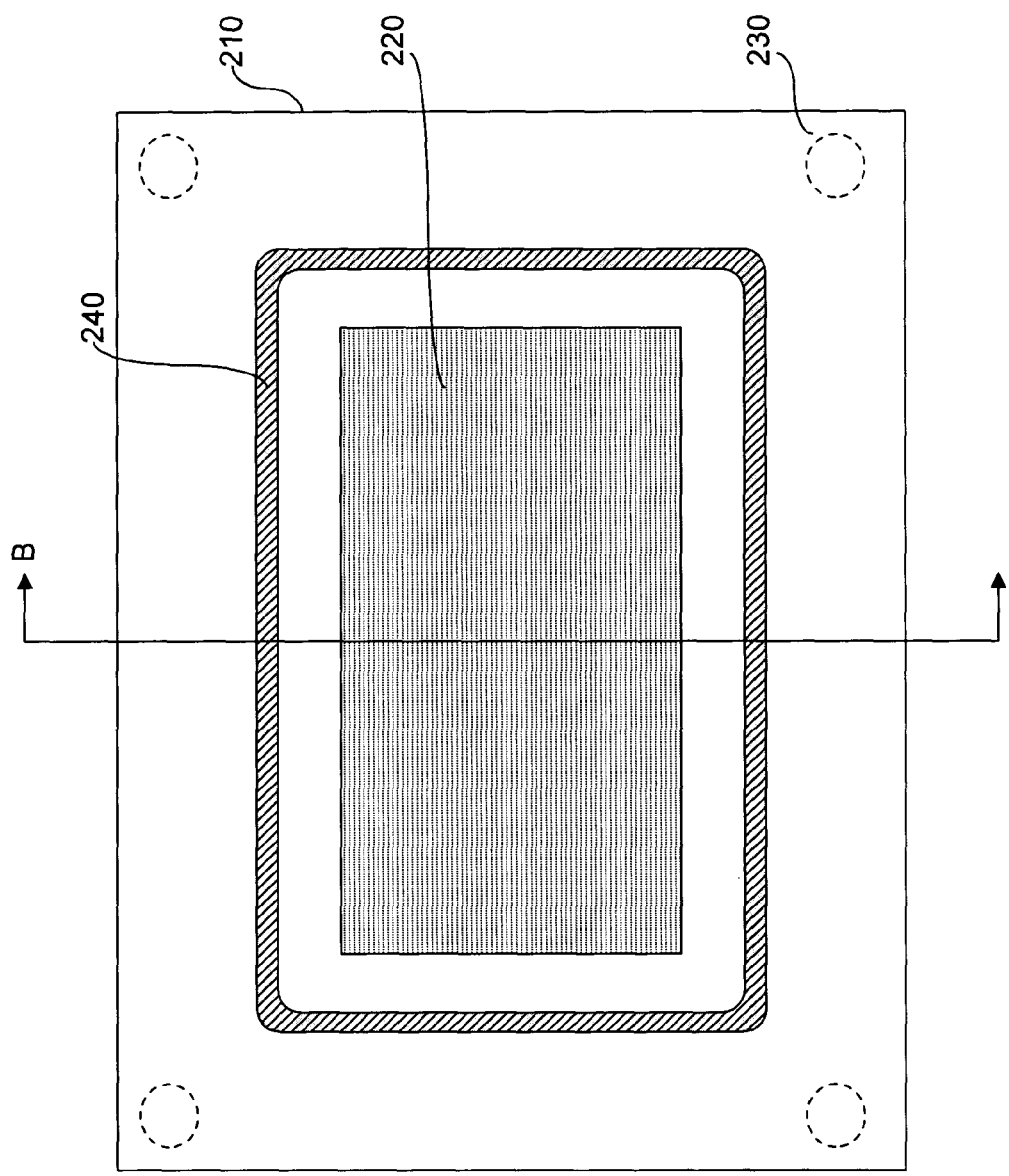
FIG. 2A is a diagram of a lithographic reticle having a mask with a mask barrier, according to an embodiment of the invention.
Figure 2B:
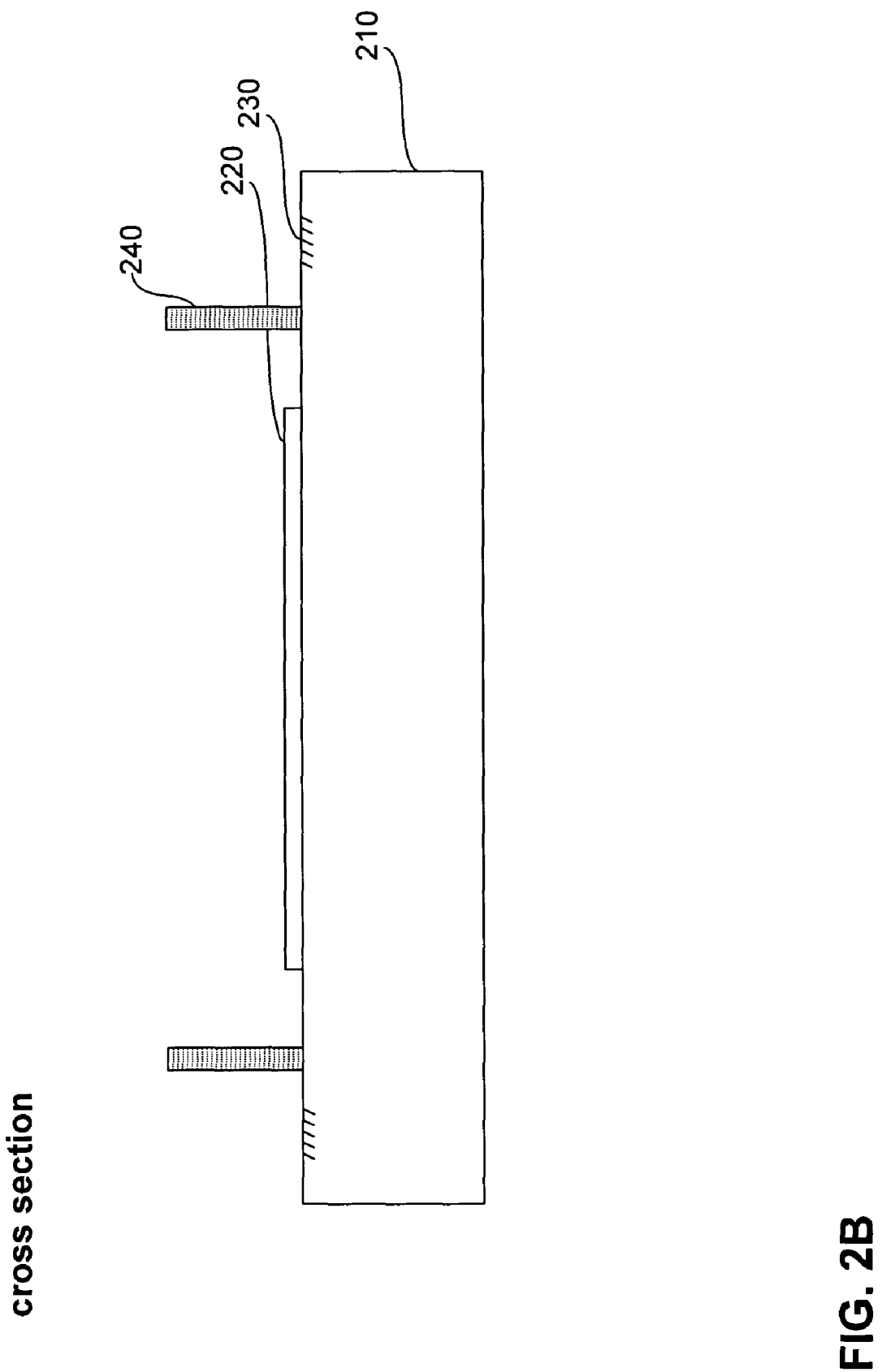
FIG. 2B is a diagram of a cross sectional view of the lithographic reticle having a mask with a mask barrier, according to an embodiment of the invention.

FIG. 2A provides a diagram of a lithographic reticle having a mask with a mask barrier, according to an embodiment of the invention. The system includes reticle 210; mask 220; contact spots, such as contact spot 230; and mask barrier 240. FIG. 2B provides a cross sectional view of the system depicted in FIG. 2A. The system in FIG. 2A can be used in an EUV lithography system. Unlike the system of FIG. 1A, pellicle frame 140 and pellicle 150 are not included in the system of FIG. 2A. Thus, without some form of mask protection, contaminants would have an unobstructed path to the surface of the mask. To address this problem, mask barrier 240 surrounds mask 220 and reduces the number of contaminants that can land on the mask surface. Mask barrier 240 achieves this objective by blocking the trajectory path of many contaminants that may originate, for example, at contact spots.

Mask barrier 240 typically can range in height from two to ten millimeters in height and several millimeters in width. The specific dimensions of mask barrier 240 are design factors, which will be influenced by the specific application, clearances within the reticle area, and environment compatibility.

In FIG. 2A, mask barrier 240 can be made from aluminum, ceramic, glass or other materials suitable for lithographic systems that will not degrade upon being subjected to extreme ultra violet light. Mask barrier 240 can be affixed to the reticle surface with double sided tape used in lithographic systems. The tape should be placed on the bottom surface of mask barrier 240, such that no tape extends beyond the edges of mask barrier 240.

The use of mask barrier 240 runs counter to traditional means, such as the use of a pellicle, to prevent contaminants from landing on the surface of a mask. An examination of contaminant characteristics within an EUV lithographic system in the area of the reticle demonstrates that contaminants typically have low energy and often originate at contact spots on the reticle that are used for moving and holding the reticle in position. Given the low energy of the contaminants, upon colliding with mask barrier 240, the contaminants come to rest on mask barrier 240 or at the base of mask barrier 240. Furthermore, while some contaminants will move away from contact spots or other points on the reticle with trajectories that would take them over mask barrier 240, many will not have the energy to sustain the trajectory and once again will be blocked by mask barrier 240. Thus, mask barrier 240 will prevent many contaminants, but not all, from landing on the surface of mask 220. Nonetheless, mask barrier 240 does address blocking particles with trajectories that have the highest likelihood of landing on a mask.

Figure 3A:
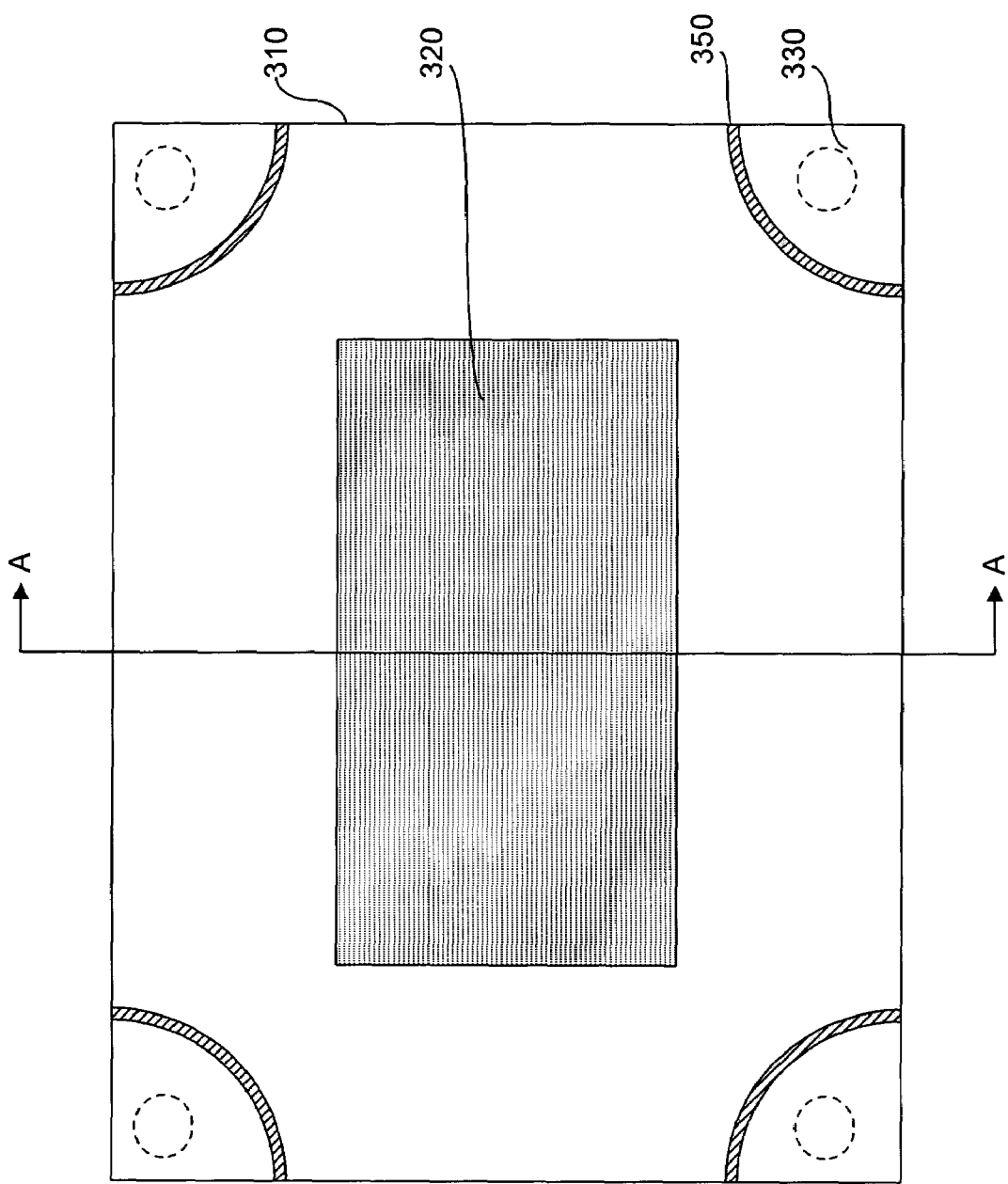
FIG. 3A is a diagram of a lithographic reticle having a mask with contact barriers, according to an embodiment of the invention.
Figure 3B:
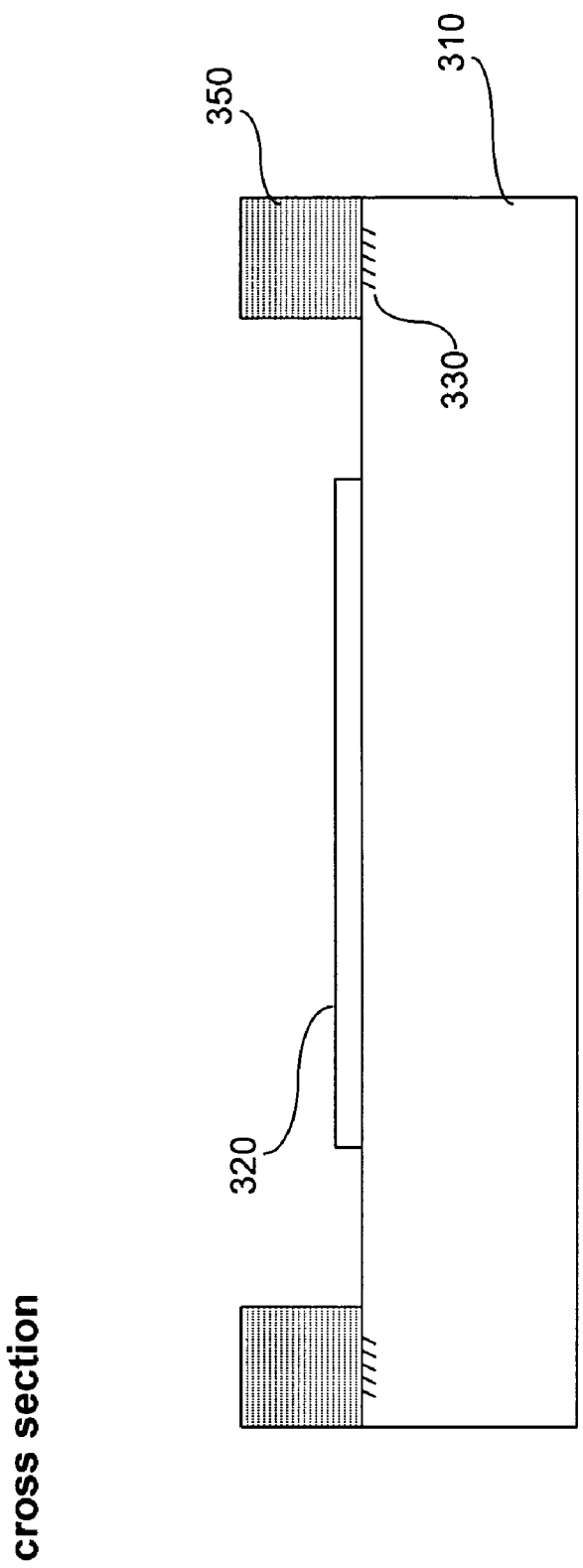
FIG. 3B is a diagram of a cross sectional view of the lithographic reticle having a mask with contact barriers, according to an embodiment of the invention.

FIG. 3A provides a diagram of a lithographic reticle having a mask with contact barriers, according to an embodiment of the invention. The system includes: reticle 310; mask 320; contact spots, such as contact spot 330; and contact barriers, such as contact barrier 350. FIG. 3B provides a cross sectional view of the system depicted in FIG. 3A. The difference between the systems depicted in FIG. 2A and FIG. 3A is the location and number of barriers. In FIG.

2A mask barrier 240 forms a single barrier around a mask. While in FIG. 3A, a set of contact barriers like contact barrier 350 forms a reticle barrier system. Like the system in FIG. 2A, this reticle barrier system can be used in an EUV lithography system. In the FIG. 3A scenario, there is no pellicle and no mask barrier. Rather a set of contact barriers, such as contact barrier 350 is used. A contact barrier, such as contact barrier 350 is affixed between mask 320 and a corresponding contact spot, such as contact spot 330. As in the case of mask barrier 240, contact barriers block the trajectory path of many contaminants. In particular, contact barriers, such as contact barrier 350 block contaminants that originate at contact spots, such as contact spot 330. As indicated above, the majority of contaminants originate at the contact spots. Therefore, an array of contact barriers can provide an alternative means, and sometimes more effective means, than mask barriers to reduce the number of contaminants that land on the surface of a mask.

Contact barriers, such as contact barrier 350 typically can range in height from two to ten millimeters in height and several millimeters in width. The specific dimensions of contact barrier 350 are design factors, which will be influenced by the specific application and the clearances within the reticle area.

Contact barriers, such as contact barrier 350, can be made from aluminum, ceramic, glass or other materials suitable for lithographic systems that will not degrade upon being subjected to extreme ultra violet light. Alternatively a wider ranges of materials can be used by configuring the contact barrier such that exposure to EUV is minimized. Contact barrier 350 can be affixed to the reticle surface with double sided tape used in lithographic systems. The tape should be placed on the bottom surface of a contact barrier, such as contact barrier 350, such that no tape extends beyond the edges of contact barrier 350. Other approaches to affixing the barrier will be known to persons skilled in the relevant arts based on the teachings herein. As in the case of mask barrier 240, contact barriers, such as contact barrier 350 can significantly reduce the number of contaminants that land on the surface of a mask.

Figure 4A:
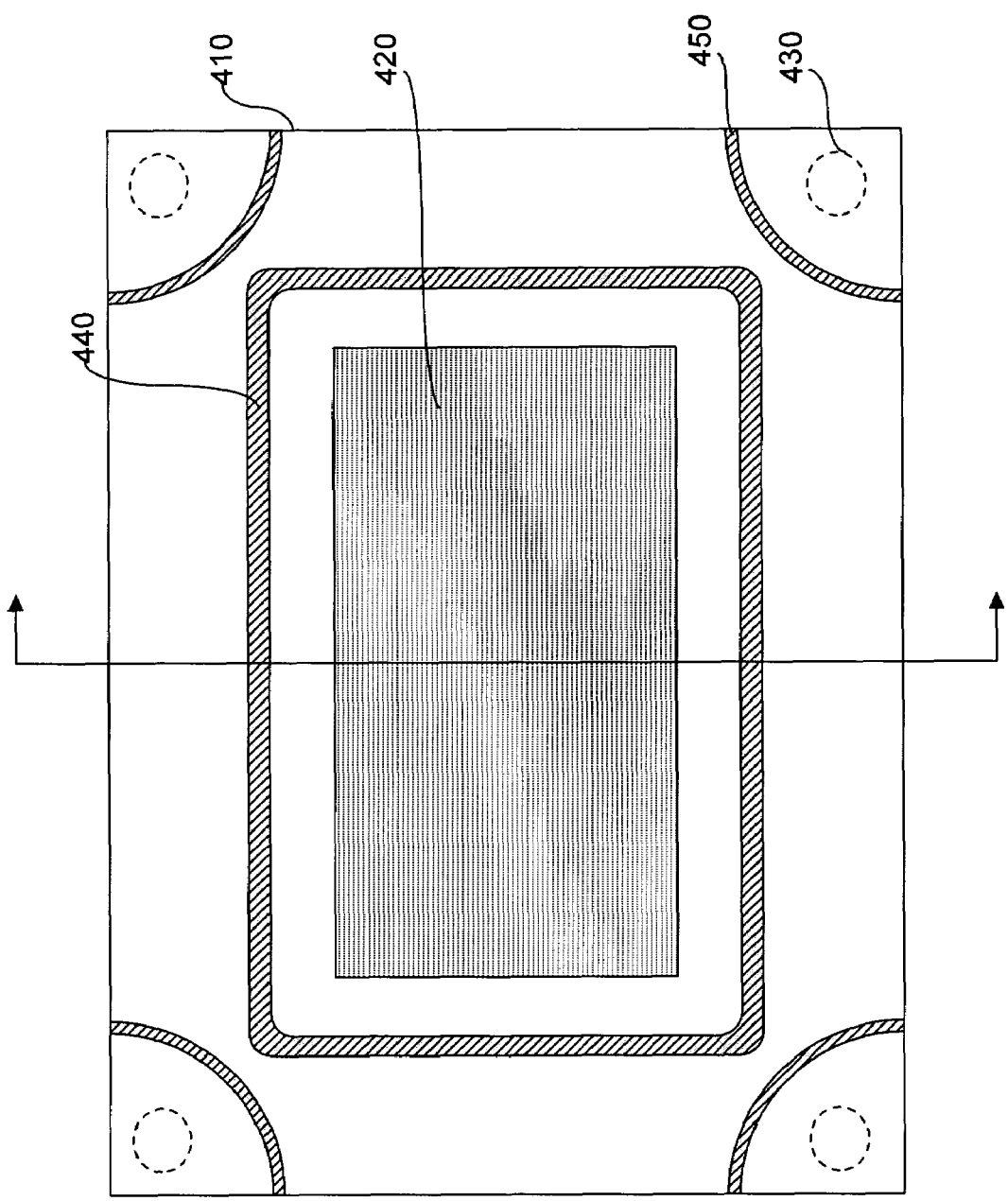
FIG. 4A is a diagram of a lithographic reticle having a mask with mask and contact barriers, according to an embodiment of the invention.
Figure 4B:
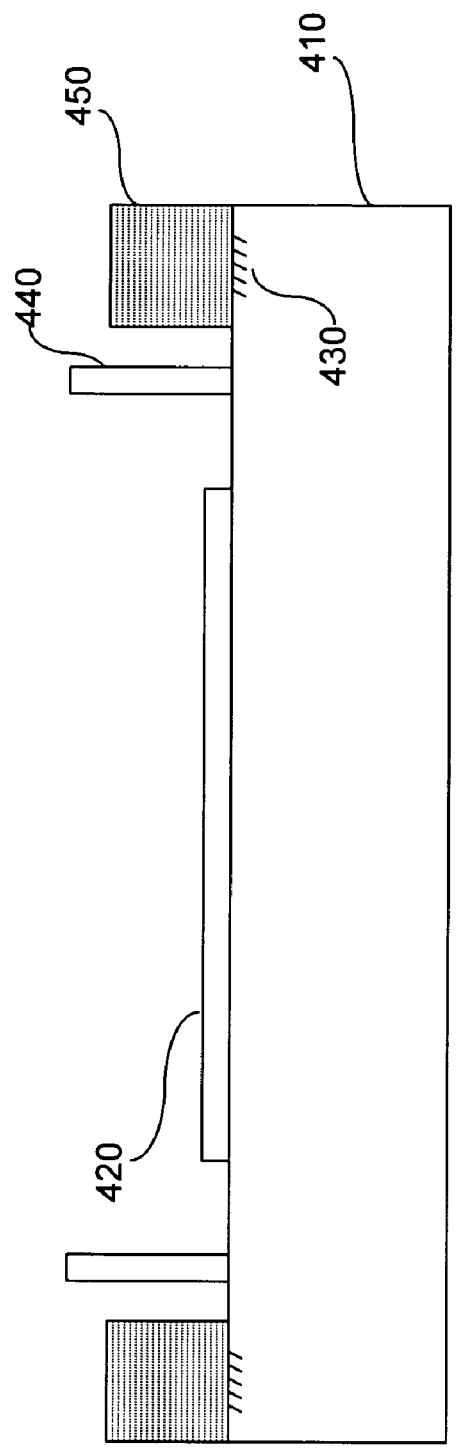
FIG. 4B is a diagram of a cross sectional view of the lithographic reticle having a mask with mask and contact barriers, according to an embodiment of the invention.

FIG. 4A provides a diagram of a lithographic reticle having a mask with mask and contact barriers, according to an embodiment of the invention. The system includes: reticle 410; mask 420; contact spots, such as contact spot 430; mask barrier 440 and contact barriers, such as contact barrier 450. FIG. 4B provides a cross sectional view of the system depicted in FIG. 4A. The reticle barrier system used within FIG. 4A combines the mask barrier shown in FIG. 2A with the contact barriers shown in FIG. 3A. The physical characteristics and description of mask barrier 440 are the same as those for mask barrier 240. Likewise, the physical characteristics and description of contact barrier 450 are the same as those for contact barrier 450. In combining both a mask barrier and contact barriers, the reticle barrier system depicted in FIG. 4A will likely reduce the number of contaminants landing on a mask more than the reticle barrier systems depicted in FIGS. 2A and 3A.

Figure 5A:
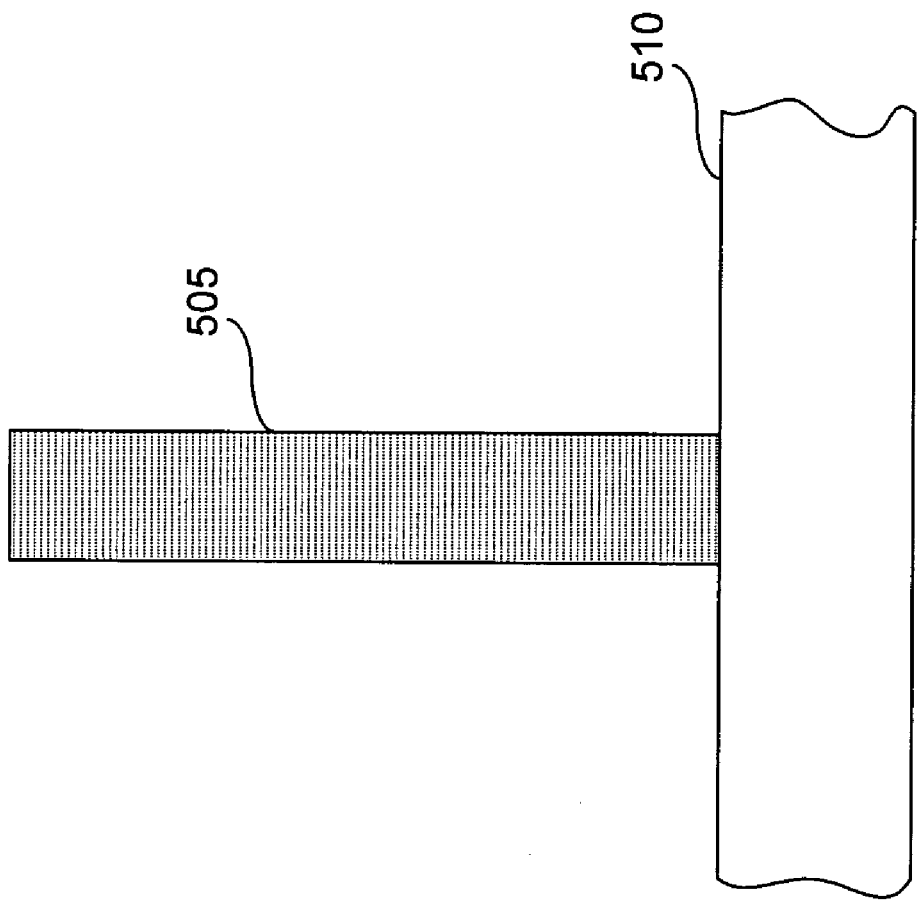
FIG. 5A is a diagram of a cross sectional view of a mask or contact barrier, according to an embodiment of the invention.
Figure 5B:
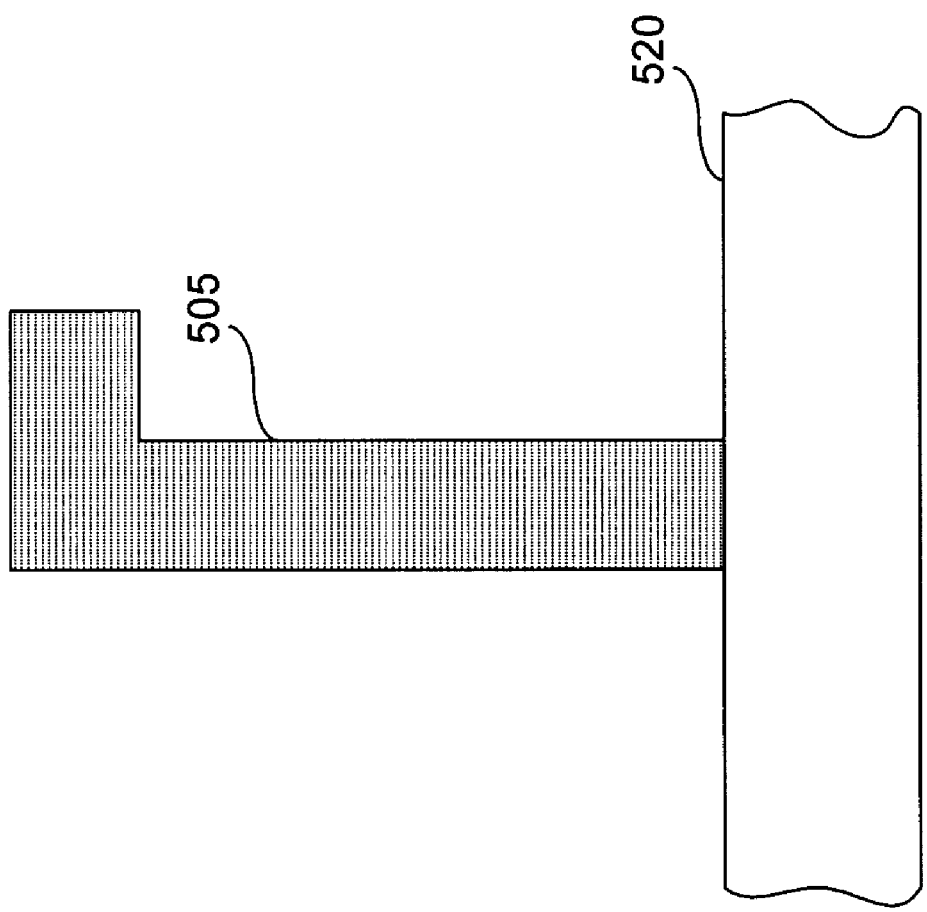
FIG. 5B is a diagram of a cross sectional view of a mask or contact barrier with a right angle flange, according to an embodiment of the invention.
Figure 5C:
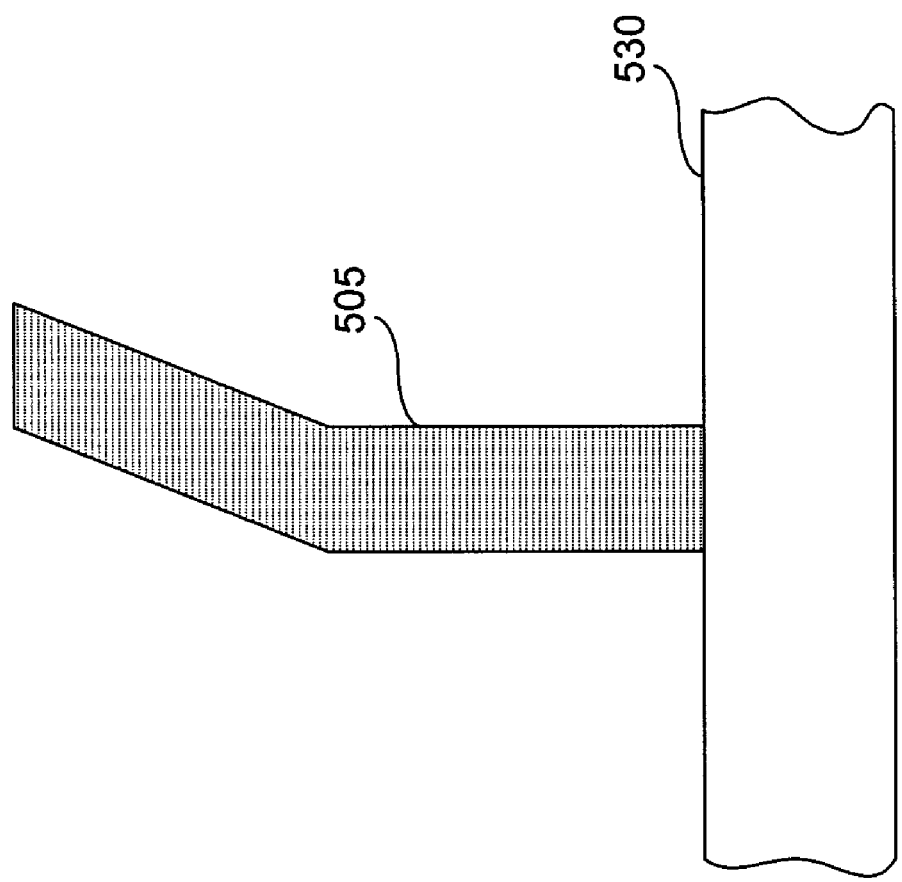
FIG. 5C is a diagram of a cross sectional view of a mask or contact barrier with an angled flange, according to an embodiment of the invention.

The reticle barrier systems depicted in FIGS. 2A, 3A, and 4A can have different geometries. In addition, the reticle barrier systems do not need to be symmetrically located on a reticle, but can be distributed in any manner on the reticle that minimizes particle contamination. FIGS. 5A, 5B, and 5C illustrate three different shapes for a mask or contact barrier. These shapes are not inclusive of all shapes, but are illustrative of possible variations. Based on the teachings herein, a person skilled in the relevant art will be able to identify additional shapes. FIG. 5A is a diagram of a cross sectional view of a mask or contact barrier, according to an embodiment of the invention. In FIG. 5A, mask or contact barrier 505 is affixed to reticle 510. In this embodiment, mask or contact barrier 505 forms a rectangular cross section that extends substantially perpendicular to reticle 510.

In FIG. 5B, mask or contact barrier 515 is affixed to reticle 520. In this embodiment, mask or contact barrier 515 has a height relative to reticle 520 with a flange that extends from mask or contact barrier 515 in a substantially parallel direction to the plane of reticle 520. When this shape is used for a mask barrier, the flange will typically extend away from a mask. Likewise, when this shape is used for a contact barrier, the flange will typically extend away from a mask and toward a contact spot.

In FIG. 5C, mask or contact barrier 525 is affixed to reticle 530. In this embodiment, mask or contact barrier 525 has a height relative to reticle 520 with a flange that extends from mask or contact barrier at an angle greater than ninety degrees measured relative to a vertical portion of mask or contact barrier 525. When this shape is used for a mask barrier, the flange will typically extend away from a mask. Likewise, when this shape is used for a contact barrier, the flange will typically extend away from a mask and toward a contact spot.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A reticle barrier system for use with a lithographic reticle having a mask formed on a front surface thereof, comprising:
   a mask barrier affixed to the front surface of the reticle, wherein said mask barrier surrounds the mask and has a height relative to the front surface of the reticle, and wherein said mask barrier blocks contaminants from the mask without the use of a pellicle.

2. The reticle barrier system of claim 1, wherein a flange extends from the mask barrier at a height relative to the front surface of the reticle.

3. The reticle barrier system of claim 2, wherein said flange extends away from the mask and substantially parallel to a plane of the mask.

4. The reticle barrier system of claim 2, wherein said flange extends away from the mask and at an angle greater than ninety degrees measured relative to a vertical position of the reticle barrier system that is substantially perpendicular to a plane of the mask.

5. The reticle barrier system of claim 1, wherein said reticle barrier system is aluminum.

6. The reticle barrier system of claim 1, wherein said reticle barrier system is ceramic.

7. The reticle barrier system of claim 1, further comprising:
   a plurality of contact barriers each having a height relative to the front surface of the reticle, wherein a contact barrier within said plurality of contact barriers is affixed to the front surface of the reticle between a contact spot on a reticle and the mask.

8. A reticle barrier system for use with a lithographic reticle having a mask formed on a front surface thereof, comprising:
   a plurality of contact barriers each having a height relative to the front surface of the reticle, wherein a contact barrier within said plurality of contact barriers is affixed to the front surface of the reticle between a contact spot on a reticle and the mask.

9. The reticle barrier system of claim 8, wherein a flange extends from the mask barrier at a height relative to the front surface of the reticle.

10. The reticle barrier system of claim 8, wherein said flange extends away from the mask in the direction of a contact spot corresponding to the contact barrier and substantially parallel to a plane of the mask.

11. The reticle barrier system of claim 8, wherein said flange extends away from the mask in the direction of a contact spot corresponding and at an angle greater than ninety degrees measured relative to a vertical position of the contact barrier that is substantially perpendicular to a plane of the mask.

12. The reticle barrier system of claim 8, wherein a contact barrier with said plurality of contact barriers is aluminum.

13. The reticle baffler system of claim 8, wherein a contact baffler within said plurality of contact barriers is ceramic.

* * * * *